July 1, 1969 H. WEINSTEIN 3,453,508

PINCH-OFF SHUNT FOR CONTROLLED RECTIFIERS

Filed Oct. 18, 1967

INVENTOR.
HAROLD WEINSTEIN
BY
OSTROLENK, FABER, GERB & SOFFEN
ATTORNEYS

United States Patent Office 3,453,508
Patented July 1, 1969

3,453,508
PINCH-OFF SHUNT FOR CONTROLLED RECTIFIERS

Harold Weinstein, Van Nuys, Calif., assignor to International Rectifier Corporation, El Segundo, Calif., a corporation of California Filed Oct. 18, 1967, Ser. No. 676,247
Int. Cl. H01l 11/02
U.S. Cl. 317—235 6 Claims

ABSTRACT OF THE DISCLOSURE

The anode electrode of a controlled rectifier extends upwardly and shunts across the lowermost junction of the controlled rectifier. A groove is cut through the central junction with the groove interposed between the emitter region and the shunt. Reverse blocking is obtained by the expanding space charge below the groove while the device withstands a higher rate-of-rise-of-forward-voltage before turn-on in the absence of a gate signal due to the bypassing of displacement current to the shunt across the lower junction. The device also provides a constant reverse leakage current level and the effects of surface leakage are minimized by the groove.

This invention relates to controlled rectifiers, and more particularly relates to a controlled rectifier having improved resistance to break-down due to a high rate-of-rise-of-forward-voltage.

It is well known that controlled rectifiers will fire when the rate-of-rise-of-forward-current exceeds some given value even though no gate signal is present. This inadvertent firing is due to the effect of displacement current flowing through the central blocking junction. The effect of the displacement current is commonly limited by the use of a "shorted emitter"; that is, the cathode contact is arranged to extend across the emitter layer and on to the control layer (or first base of the equivalent transistor circuit), thereby providing a shunt path for carriers moving across the blocking junction.

The present invention provides a novel structure which tends to prevent firing of a controlled rectifier due to high rate-of-rise-of-forward-voltage which is superior in operation to the shunted emitter arrangement, and additionally provides a novel device having a small constant reverse current. More particularly, a conductive shunt is placed across the lowermost junction of the controlled rectifier in combination with a groove through the central junction.

This shorted arrangement, under forward voltage conditions, will serve as a bypass for displacement currents which would normally cause rate-of-rise-of-forward-voltage triggering. The effect of a short circuit on the lowermost junction during reverse-blocking conditions is eliminated, however, by the groove, which causes a pinch-off effect due to an expanding space charge beneath the groove, thereby isolating the shorted periphery of the lower junction so that the lower junction may assume its blocking function under reverse-voltage conditions.

This novel effect has been further found to produce a constant low-leakage current in the reverse direction, as contrasted to a continually increasing leakage current as a function of reverse voltage which is obtained in prior art types of controlled rectifiers. The constant reverse-leakage current can be useful in many circuit applications, as will be apparent to those skilled in the art.

Accordingly, a primary object of this invention is to provide a controlled rectifier having improved rate-of-rise-of-forward-voltage characteristics.

Yet another object of this invention is to form a rectifier having a constant reverse leakage current.

These and other objects of this invention will become apparent from the following description when taken in connection with the drawings in which.

Figure 1:
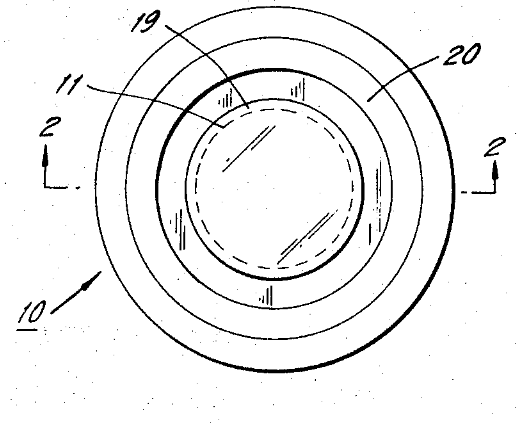
FIG. 1 (PRIOR ART)
FIGURE 1 is a top plan view of a prior-art type controlled rectifier structure.
Figure 2:
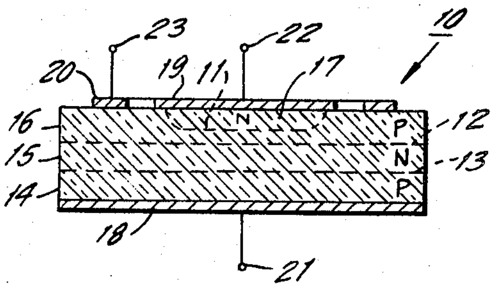
FIGURE 2 is a cross-sectional view of FIGURE 1 taken across the section line 2—2 in FIGURE 1.

Referring first to FIGURES 1 and 2, the prior-art type controlled rectifier is comprised of a wafer 10 of semiconductor material, such as monocrystalline silicon, which contains three junctions 11, 12 and 13 therein defining a lower P-type conductivity region 14, an intermediate N-type region 15, an intermediate P-type region 16, and an upper N-type region 17. An anode contact 18 is then connected across the bottom of P-type region 14 and a cathode contact 19 is connected atop the N-type region 17 and extends slightly beyond the periphery of junction 11. This defines the so-called "shorted emitter" arrangement which is used in the prior art to limit inadvertent firing of the controlled rectifier by excessive rate-of-rise-of-forward-voltage.

A control gate 20 is then provided atop the layer 16 and is shown as a ring-type gate. Leads 21, 22 and 23 are then connected to electrodes 18, 19 and 20, respectively.

In the device of the type shown in FIGURES 1 and 2, and when the device is forward-biased by the application of a positive potential to lead 21 and a negative potential to lead 22, junctions 11 and 13 will be forward-biased, while junction 12 is reverse-biased. Upon the application of a high rate-of-rise-of-forward-voltage and due to the capacitance of reverse-biased junction 12, a displacement current will flow across the junction 12, causing the cathode emitter layer 17 to inject electrons across junction 11 and into the P-type base layer 16. Some of these electrons will move across layer 16 to be collected at junction 12 and then swept across junction 12 and into the second equivalent base layer 15. These electrons, plus those produced by avalanche multiplication, disturb the charge neutrality of the second base 15 so that holes will be injected across junction 13, from the lower P-type layer 14. If these effects are pronounced—that is, if the capacitance of junction 12 times the rate-of-rise-of-forward-voltage is high enough—the device will turn on even though the gate signal applied to gate 20 is insufficient to cause turn-on.

This effect has been decreased in the past by causing the cathode contact 19 to extend across junction 11 and into contact with the first base region 16, as shown in FIGURE 2. This reduces the efficiency of cathode injection by providing a shunt path for holes which have moved across junction 12, and allows the device to withstand higher rate-of-rise-of-forward-voltage without turning on.

Figure 3:
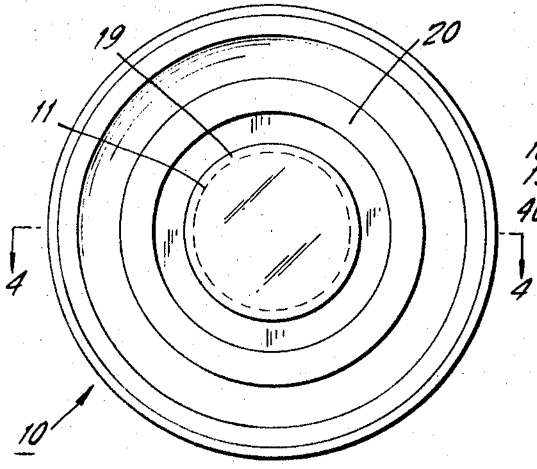
FIGURE 3 is a top plan view of the controlled rectifier of the present invention.
Figure 4:
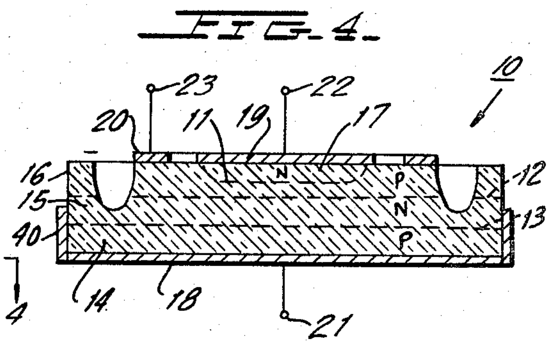
FIGURE 4 is a cross-sectional view of FIGURE 3 taken across the section line 4—4 in FIGURE 3.

The present invention provides a novel structure for improving the ability of the device to withstand high-rate-of-rise-of-forward-current, the novel device being illustrated in FIGURES 3 and 4. In FIGURES 3 and 4, elements similar to those of FIGURES 1 and 2 have been given identical identifying numerals.

In accordance with the invention, a device quite similar to that of FIGURES 1 and 2, and which may retain the shorted emitter, is further provided with a peripheral shunt 40 which encircles the lower portion of the wafer 10 and is connected to the anode electrode 18, and short-circuits the periphery of junction 13. In combination with this shorting band 40, a groove 41 is formed which extends around the wafer and cuts through junction 12.

In operation, and upon the application of a forward bias between electrodes 21 and 22 which reverse-biases junction 12, it will be understood that due to the displacement current effect, carriers will flow through base region 16 and base region 15, as described above for FIGURE 2. However, these carriers will now find a by-pass through the region between junction 13 and the bottom of groove 41 to the peripheral contact 40. Thus, the conductive band 40 will prevent some of the displacement current which would normally flow under rate-of-rise-of-forward-voltage from reaching the anode layer 14 across junction 13, and similarly would absorb some of the hole injection from the anode layer 14 through the second base 15 and into the first base 16, accordingly, higher values of rate-of-rise-of-forward-voltage can be applied to the device of FIGURES 3 and 4 without turn-on in the absence of a gate signal applied to lead 23.

As a further advantage of the invention, the provision of groove 41 causes an increased surface area to surface currents which may flow between the ohmic contacts on the opposite surfaces of the wafer. Thus, the contribution to inadvertent turn-on due to rate-of-rise-of-forward-voltage by surface-leakage current will be reduced.

Figure 5:
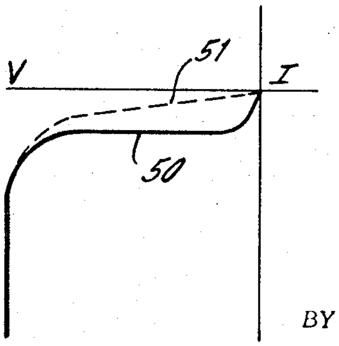
FIGURE 5 is a graph showing the reverse-current characteristics of the controlled rectifier of FIGURES 3 and 4.

When the device is reverse-biased and a positive potential is connected to lead 22, while a negative potential is connected to lead 21, the junctions 11 and 13 will be reverse-biased and must withstand reverse voltages applied to the device. In this case, when the reverse voltage is applied, an increased space charge layer is formed on either side of junction 13 and this space charge layer widens with increased voltage to progressively pinch-off current flow between the peripheral contact 40 and cathode 19 until this current flow is virtually completely pinched-off, with the reverse-leakage current of the device remaining constant until avalanche break-down occurs. While the leakage current of the device is somewhat higher than that of the standard controlled rectifier under low reverse voltage conditions, the leakage current remains constant until avalanche break-down. This unusual effect is illustrated in FIGURE 5 which shows reverse-voltage characteristics of the device in solid line 50, as compared to the prior-art standard characteristic shown in dotted line 51. Controlled rectifiers having this constant reverse-leakage current characteristic can find use in various circuit applications.

In manufacturing the device of FIGURES 3 and 4, it will be apparent that standard manufacturing techniques can be used similar to those for the production of the device shown in FIGURE 2. Thereafter, the groove 41 may be etched into the device in any desired manner and the groove may, if desired, be potted with a suitable potting medium to insure cleanliness of the groove surfaces. The peripheral contact 40 may be subsequently applied in any desired manner about the periphery of junction 13. Note that the device could also be constructed without the shorted emitter configuration, with contact 19 extending across junction 11, if desired. Clearly, a reverse polarity device using an opposite sequence of conductivity-type layers could also be used with the present invention and any desired type of gate configuration could also be used.

In a preferred form of the invention, the wafer may have a diameter of .5 inch and a thickness of .015 inch. The depth of junctions 11, 12 and 13 from the top of the wafer is approximately 1, 2.5 mils and 8 mils, respectively, while the groove 41 has a depth of about 7.5 mils. Preferably, the bottom of groove 41 is spaced from junction 13 by from .2 mils to .5 mils and the groove 41 may have a width of 50 mils and an outside diameter of .450 inch. The peripheral contact 40 may be applied to the device in any desired manner, and may have a height of 10 mils from the bottom of the wafer.

Although this invention has been described with respect to its preferred embodiments, it should be understood that many variations and modifications will now be obvious to those skilled in the art and it is preferred, therefore, that the scope of this invention be limited not by the specific disclosure herein, but only by the appended claims.

The embodiments of the invention in which an exclusive privilege or property is claimed are defined as follows:

1. A semiconductor device comprising a wafer of semiconductor material having first, second, third and fourth sequentially arranged layers of alternately opposite conductivity types and defining respective first, second and third P-N junctions; an anode electrode connected to the bottom of said first layer of said four layers; a cathode electrode connected to the top of said fourth layer of said four layers; said fourth layer embedded in said third layer with a portion of the top surface of said third layer surrounding and being coplanar with the top surface of said fourth layer; an annular groove extending into said third layer from its said top surface and spaced from and surrounding said fourth layer; said annular groove cutting through said second junction and having a bottom terminating in said second layer; and a metallic contact connected to said anode electrode across the periphery of said first junction between said first and second layers.

2. The device of claim 1 which further includes a gate electrode connected to said top surface of said third layer; said gate electrode positioned between said groove and said fourth layer.

3. The device of claim 2 wherein said gate electrode is a ring spaced from and surrounding said fourth layer.

4. The device of claim 1 wherein said cathode electrode extends across said third junction and contacts said third layer.

5. The device of claim 1 wherein said metallic contact extends around the full periphery of said first junction.

6. The device of claim 1 wherein said first and second junctions extend to the edge of said wafer.

References Cited

UNITED STATES PATENTS 2,993,154 7/1961 Goldey et al. -------- 317—235
3,316,465 4/1967 Bernuth et al. ------- 317—235

JOHN W. HUCKERT, *Primary Examiner.*

JERRY D. CRAIG, *Assistant Examiner.*

U.S. Cl. X.R.

317—234